United States Patent
Kim et al.

(10) Patent No.: US 7,572,338 B2
(45) Date of Patent: Aug. 11, 2009

(54) MASK FOR DEPOSITING THIN FILM OF FLAT PANEL DISPLAY AND METHOD OF FABRICATING THE MASK

(75) Inventors: Eui-Gyu Kim, Suwon-si (KR); Tae-Hyung Kim, Suwon-si (KR)

(73) Assignee: Samsung SDI Co., Ltd., Gyeonggi-Do (KR)

( * ) Notice: Subject to any disclaimer, the term of this patent is extended or adjusted under 35 U.S.C. 154(b) by 523 days.

(21) Appl. No.: 11/281,826

(22) Filed: Nov. 17, 2005

(65) Prior Publication Data
US 2006/0110663 A1 May 25, 2006

(30) Foreign Application Priority Data
Nov. 25, 2004 (KR) .................... 10-2004-0097514

(51) Int. Cl.
*C23C 16/00* (2006.01)
(52) U.S. Cl. .................. 118/720; 118/504; 118/620; 427/282; 430/5
(58) Field of Classification Search ............. 430/5; 118/504, 620, 720, 721; 427/66, 282
See application file for complete search history.

(56) References Cited

U.S. PATENT DOCUMENTS

| 2003/0059690 A1* | 3/2003 | Yotsuya | 430/5 |
|---|---|---|---|
| 2003/0101932 A1* | 6/2003 | Kang | 118/504 |
| 2004/0104197 A1* | 6/2004 | Shigemura et al. | 216/20 |
| 2004/0109153 A1* | 6/2004 | Vroman et al. | 355/75 |
| 2004/0115342 A1* | 6/2004 | Shigemura | 427/143 |
| 2004/0197675 A1* | 10/2004 | Shibata et al. | 430/5 |

FOREIGN PATENT DOCUMENTS

| JP | 2002-055461 | 2/2002 |
|---|---|---|
| JP | 2002-305080 | 10/2002 |
| JP | 2003-107723 | 4/2003 |
| JP | 2003-308966 | 10/2003 |
| JP | 2003-332057 | 11/2003 |
| JP | 2004-087466 | 3/2004 |

(Continued)

OTHER PUBLICATIONS

Office Action issued by the Japanese Patent Office on Jun. 16, 2009.

*Primary Examiner*—Mark F Huff
*Assistant Examiner*—Stewart A Fraser
(74) *Attorney, Agent, or Firm*—Knobbe Martens Olson & Bear LLP (57) ABSTRACT

A mask for depositing a thin film of a flat panel display and a method of fabricating the mask are disclosed. Embodiments of the mask can improve position accuracy and prevent problems caused by thermal expansion of the mask by attaching a reinforcing member and mask pattern units arranged on openings of the reinforcing member using a buffer member. The mask includes a reinforcing member including a plurality of first openings; mask pattern units arranged corresponding to the first openings of the reinforcing member and supported by the reinforcing member; and a buffer member including a plurality of second openings corresponding to the first openings of the reinforcing member, and attaching the reinforcing member to the mask pattern units to support the reinforcing member and the mask pattern units.

21 Claims, 7 Drawing Sheets

FOREIGN PATENT DOCUMENTS

| | | |
|---|---|---|
| JP | 2004-169169 | 6/2004 |
| JP | 2004-296436 | 10/2004 |
| JP | 2005-281745 | 10/2005 |
| KR | P2003-0009324 | 1/2003 |
| KR | 1020030046090 | 6/2003 |
| KR | 1020030093959 | 12/2003 |

* cited by examiner

- FORM MASK PATTERN UNIT OF PATTERN MASK ON BASE METAL USING ELECTRIC PLATING METHOD — S41
- APPLY PHOTOSENSITIVE LAYER ON PATTERN MASK — S42
- EXPOSE SOME PARTS OF PHOTOSENSITIVE LAYER CORRESPONDING TO MASK PATTERN UNIT OF PATTERN MASK — S43
- ATTACH REINFORCING RIB ONTO PATTERN MASK — S44
- DEVELOP SOME PARTS OF PHOTOSENSITIVE LAYER CORRESPONDING TO MASK PATTERN UNIT OF PATTERN MASK — S45
- BOND MASK PATTERN UNIT WITH REINFORCING RIB BY ELECTRIC PLATING METHOD — S46
- SEPARATE BASE METAL FROM MASK PATTERN UNIT — S47
- REMOVE PHOTOSENSITIVE LAYER — S48
- ATTACH MASK ONTO MAIN FRAME — S49

MASK FOR DEPOSITING THIN FILM OF FLAT PANEL DISPLAY AND METHOD OF FABRICATING THE MASK

CROSS-REFERENCE TO RELATED PATENT APPLICATIONS

This application claims the benefit of Korean Patent Application No. 10-2004-0097514, filed on Nov. 25, 2004, in the Korean Intellectual Property Office, the disclosure of which is incorporated herein in its entirety by reference.

BACKGROUND OF THE INVENTION

1. Field of the Invention

The present invention relates to a mask for depositing a thin film of a flat panel display, and more particularly, to a mask for depositing a thin film of a flat panel display bonding an reinforcing member and a mask pattern unit portion arranged on an opening portion of the reinforcing member, and a method of fabricating the mask.

2. Description of the Related Technology

Organic light emitting devices (OLEDs) that are self-emitting devices have some advantages such as wide viewing angle, high contrast, and fast response speed, and thus, are considered next generation flat panel display devices. The OLED includes an anode, a cathode, and an organic layer having a light emission layer between the two electrodes. The organic layer is formed with a deposition method since the materials are sensitive to humidity and cannot be formed using a general photolithography process.

Figure 1:
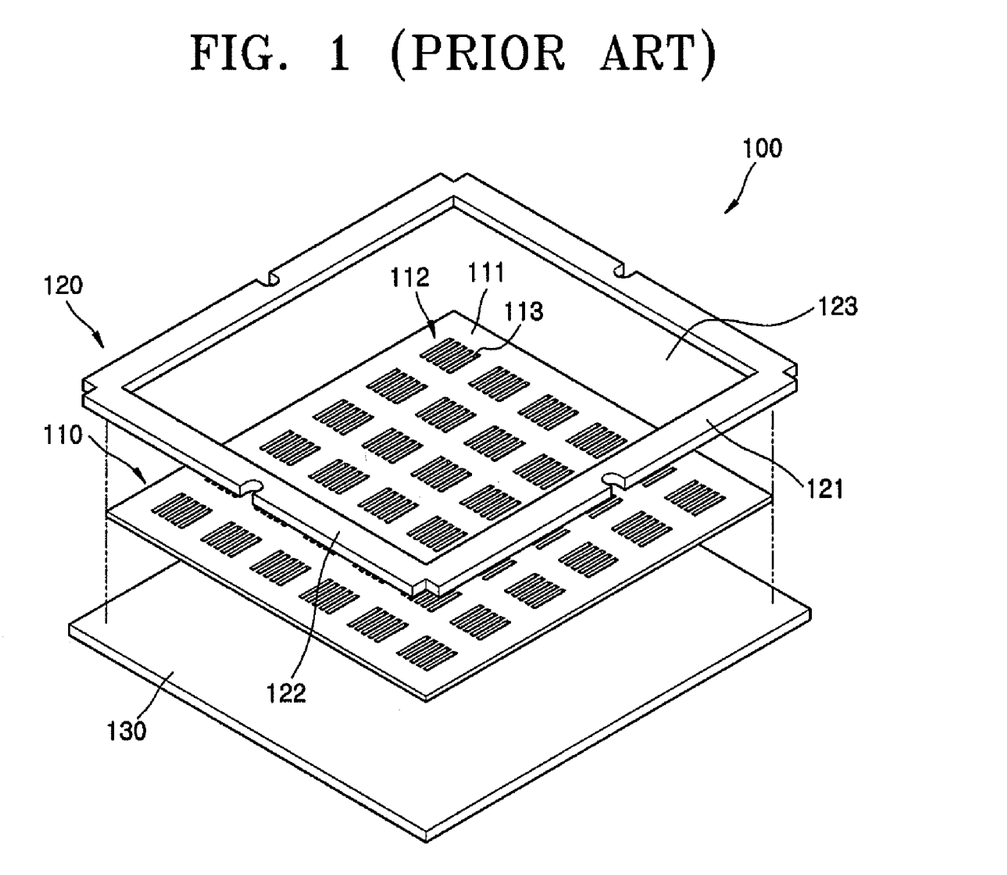
FIG. 1 is an exploded perspective view of a mask frame assembly for depositing a thin film of a flat panel display according to the conventional art.

FIG. 1 is an exploded perspective view of a conventional deposition mask frame assembly for depositing a thin film of a flat panel display device. Referring to FIG. 1, the mask frame assembly is for depositing the thin film such as the organic layer of the OLED.

Referring to FIG. 1, the conventional mask frame assembly 100 includes a pattern mask 110 and a frame 120 supporting the pattern mask 110. The frame 120 includes left and right supporting bars 121 and upper and lower supporting bars 122 for supporting the pattern mask 110, and a single opening portion 123.

The pattern mask 110 is a thin metal plate 111 including a plurality of mask pattern units 112. Here, the pattern mask 110 includes a plurality of mask pattern units 112 so as to fabricate a plurality of unit devices including the OLEDs on a deposition target substrate 130, that is, a motherboard.

The plurality of mask pattern units 112 are arranged corresponding to the unit devices, respectively, and each of the mask pattern units includes a plurality of openings 113 having the same patterns as those of the thin film of the unit device that will be deposited on the deposition target substrate 130. The pattern mask 110 is fixed onto the frame 120 by tensile forces applied from the sides.

When the pattern 110 is fixed onto the frame 120 of a lattice form, the tensile force should be applied evenly and a width of the opening 113 formed on the mask pattern unit 112 of the pattern mask 110 should be maintained within a predetermined tolerance.

A conventional metal thin plate mask of large area, the mask may droop due to the weight of the mask itself even when the mask is fixed on the frame. When the tensile force is applied to the mask in order to prevent the mask from being drooping, the left and right supporting bars 121 of the frame 120 are curved inward and the upper and lower supporting bars 122 are curved convexly to upper and lower directions, or the left and right supporting bars 121 are curved outward and the upper and lower supporting bars 122 are curved inward.

As described above, even when the pattern mask 110 is fixed on the frame 120 with a tensile force applied evenly across its surface, the openings 113 of the mask pattern unit 112 are distorted, and thus, the electrode pattern (not shown) of a unit device formed on the substrate is inconsistent with the desired opening portion 113 of the mask pattern unit 112.

In order to solve the above problems, Korean Laid-open Patents No. 2003-0046090 and No. 2003-0093959 disclose a mask frame assembly for depositing a thin film of an OLED, in which a pattern mask fixed on the frame is divided into a plurality of unit pattern masks, and both ends of the divided unit pattern mask are fixed to the frame while under tensile stress.

In addition, the conventional pattern mask 110 forms the mask pattern unit 112 as a metal thin plate etched in a photo process using a photosensitive film. The accuracy of the opening and position accuracy of pixels needs to be improved. Therefore, Japanese Laid-open Patent No. 2002-055461 and Korean Laid-open Patent No. 2003-0009324 disclose a method of fabricating a metal mask using an electric plating method.

SUMMARY OF CERTAIN INVENTIVE EMBODIMENTS

One embodiment discloses a mask for depositing a thin film of a flat panel display and a fabrication method thereof, with improved robustness, accuracy of opening, and position accuracy of the mask by bonding a mask pattern unit disposed on the opening of a reinforcing member using a buffer member.

One embodiment has a mask including a reinforcing member including at least one first opening, at least one mask pattern unit arranged at locations corresponding to the at least one first opening and supported by the reinforcing member, and a buffer member including at least one second opening corresponding to the at least one first opening, and the reinforcing member being attached to the at least one mask pattern unit so as to support the reinforcing member and the at least one mask pattern unit.

Another embodiment has a mask frame assembly including a mask including at least one mask pattern unit including a plurality of first openings having a predetermined pattern, where the mask is configured to deposit a thin film of the same predetermined pattern on a target substrate, a reinforcing member including at least one second opening which corresponds to the at least one mask pattern unit, and a buffer member including at least one third opening corresponding to the at least one second opening, and attaching the reinforcing member to the at least one mask pattern unit so as to support the reinforcing member and the at least one mask pattern unit, and a frame including a fourth opening, the frame being configured to receive and support the mask.

Another embodiment includes a method of fabricating a mask. The method includes forming a plurality of mask pattern units on a base metal, forming a masking material on the base metal, attaching a reinforcing member on the masking material. The reinforcing member includes openings corresponding to the mask pattern units. The method also includes removing portions of the masking material corresponding to the mask pattern units, attaching the mask pattern units onto the reinforcing member using a buffer member, separating the base metal from the mask pattern units, and removing the masking material.

BRIEF DESCRIPTION OF THE DRAWINGS

The above and other features and advantages of certain inventive aspects are discussed with further detailed exemplary embodiments with reference to the attached drawings in which.

DETAILED DESCRIPTION OF CERTAIN INVENTIVE EMBODIMENTS

Figure 2:
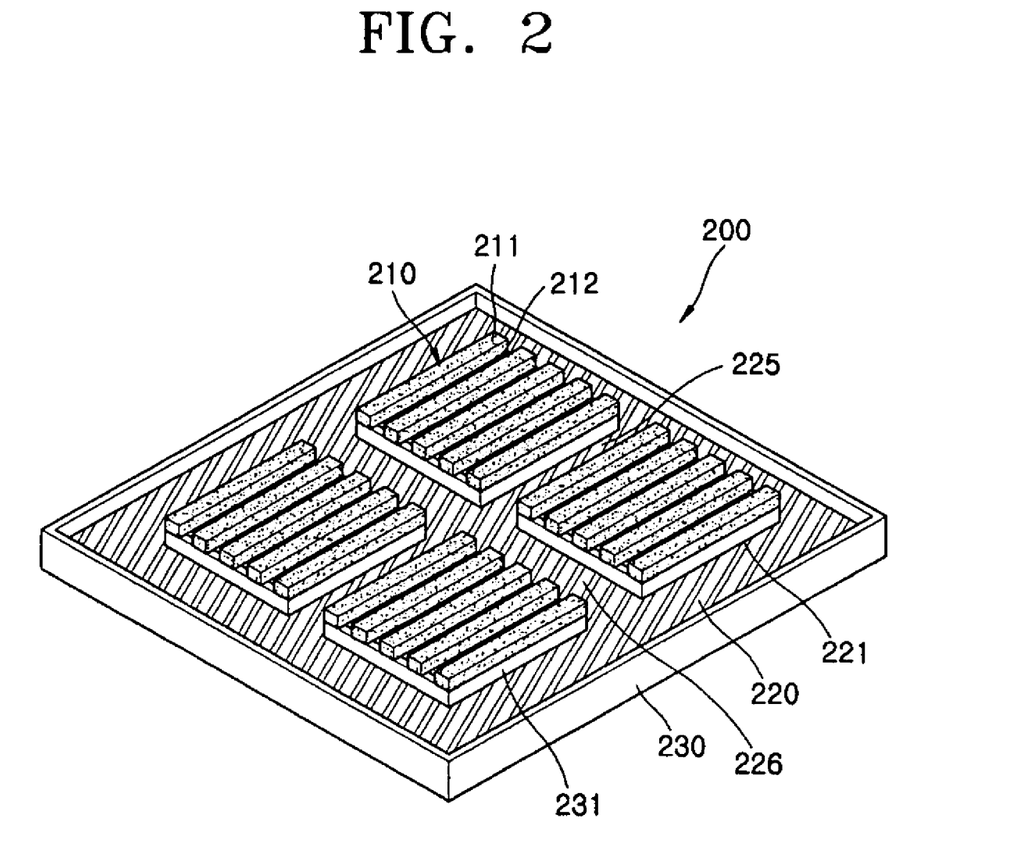
FIG. 2 is a perspective view of a mask for depositing thin film of a flat panel display according one embodiment.
Figure 3A:
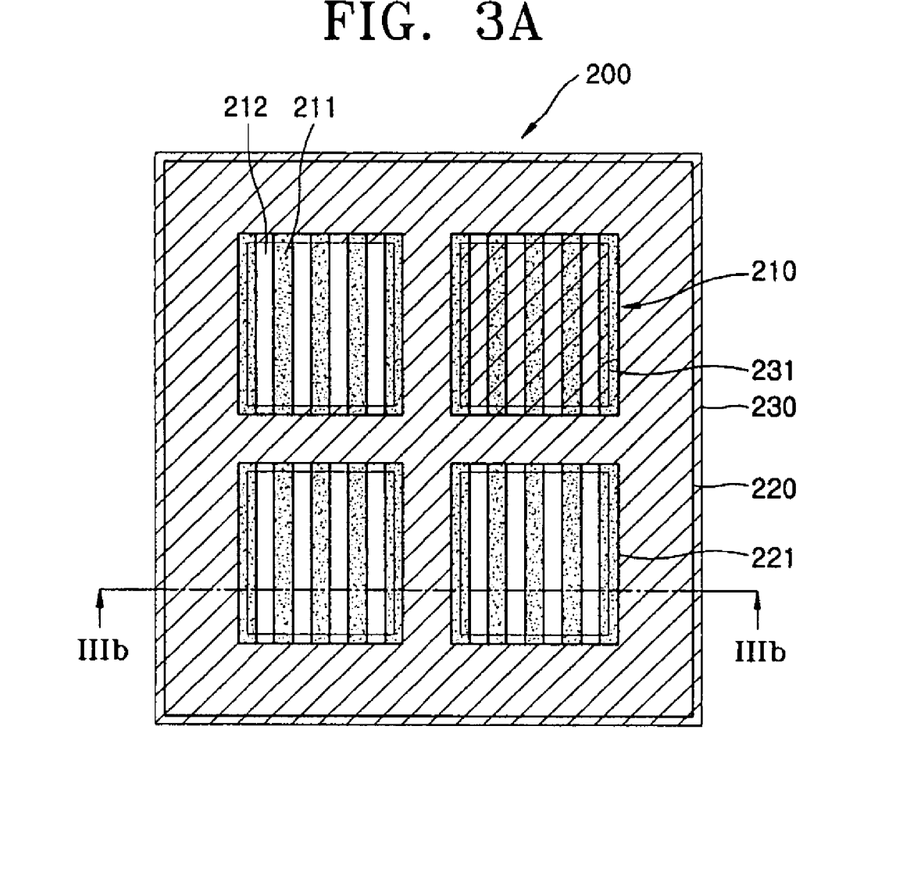
FIG. 3A is a plan view of the mask for depositing the thin film of the flat panel display according one embodiment.
Figure 3B:
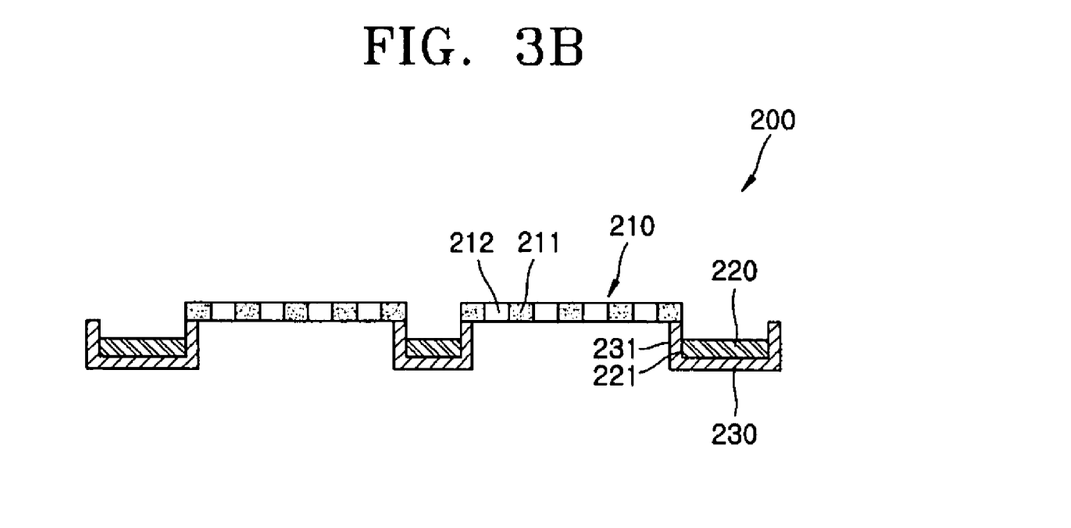
FIG. 3B is a cross-sectional view of the mask for depositing the thin film according to one embodiment.

FIG. 2 is a perspective view of a mask for depositing a thin film of a flat panel display according one embodiment, FIG. 3A is a plan view of the mask for depositing the thin film of the flat panel display according to one embodiment, and FIG. 3B is a cross-sectional view of the mask for depositing the thin film according to one embodiment taken along line IIIb-IIIb of FIG. 3A.

Referring to FIGS. 2, 3A, and 3B, a mask 200 according to one embodiment includes a reinforcing member 220 including a plurality of openings 221, and mask pattern units 210 arranged on the openings 221 of the reinforcing member 220. The reinforcing member 220 includes a first rib 225 for dividing the openings arranged in a predetermined direction, and a second rib 226 for dividing the openings 221 arranged in another direction.

The mask pattern unit 210 may be formed of Ni—Co alloy film, and the reinforcing member 220 may be formed of an invar, that is, Fe—Ni alloy film. Invar is a metal alloy that exhibits a near zero coefficient of thermal expansion. The openings 221 of the reinforcing member 220 are arranged corresponding to a plurality of unit devices that are disposed on a deposition target substrate (400, refer to FIG. 7). On the reinforcing member 220, the mask pattern units 210 are arranged on the openings 221, and the reinforcing member 200 performs as reinforcing ribs supporting the mask pattern units 210.

Here, the unit device is a display device fabricated by cutting the deposition target substrate, that is, a single mother board, along a scribe line. That is, the mask pattern unit 210 arranged on the opening 221 of the reinforcing member 220 has the same pattern as that of the thin film forming the display device.

The mask pattern unit 210 includes a plurality of openings 212 having the same pattern as that of the thin film that will be deposited on the deposition target substrate, and a plurality of shielding units 211. The plurality of openings 212 are defined by the plurality of shielding units 211. In the present embodiment, the openings 212 are formed as slots, but they can be formed variously according to the pattern of the thin film that will be deposited on the deposition target substrate.

The mask 200 further includes a buffer member 230 for bonding the reinforcing member 220 and the mask pattern units 210 arranged on the openings 221 of the reinforcing member 220, and supporting the reinforcing member 220.

The buffer member 230 includes a plurality of openings 231 corresponding to the openings 221 of the reinforcing member to open the mask pattern units 210. The buffer member 230 is formed of a conductive material such as Ni—Co alloy film.

In the present embodiment, a Ni—Co alloy film is used as the buffer member 230, however, other materials may be used. Materials with a conductive material having a low thermal expansion coefficient that can relieve stress and prevent thermal transformation may be advantageous.

Referring to FIG. 3B, the buffer member 230 can connect the mask pattern unit 210 to the reinforcing member 220, and is configured to be fixed to the reinforcing member 220, and thus, support the reinforcing member 220 and relieve the stress.

As described above, since the mask 200 has a triple structure, in which the mask pattern units 210 are supported by the openings 221 of the reinforcing member 220, and the mask pattern units 210 and the reinforcing member 220 are connected to and supported by the buffer member 230, the bonding strength of the mask can be reinforced and the stress can be relieved.

In addition, since the reinforcing member 220 is formed of the invar material having a low coefficient of thermal expansion, the mask is insensitive to changes in temperature when the thin film is deposited on the substrate, and thus, the deformation of the mask due to temperature change is mitigated.

Figure 4:
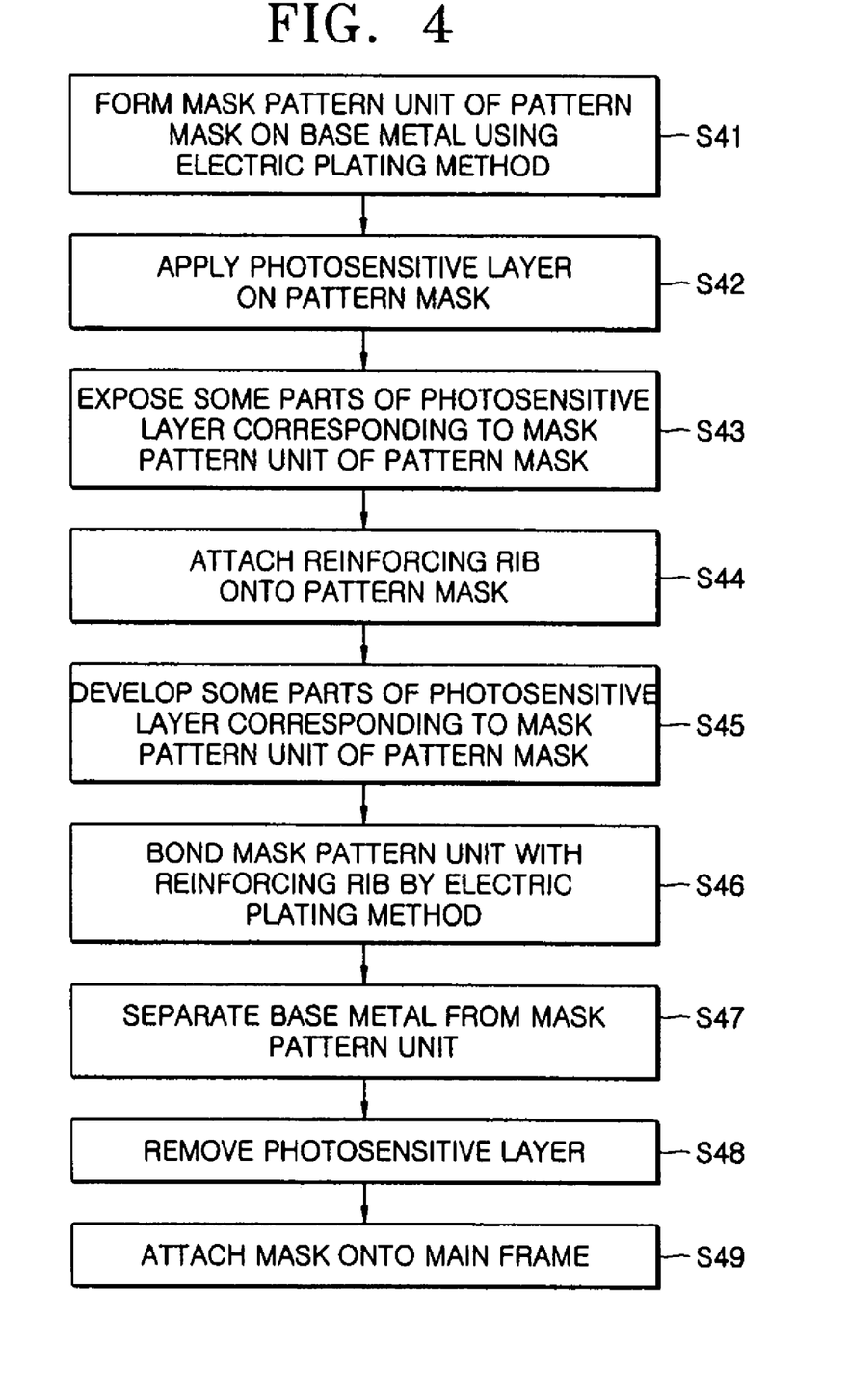
FIG. 4 is a flowchart illustrating a method of fabricating a mask for depositing thin film of a flat panel display according to one embodiment.

FIG. 4 is a flow chart illustrating processes of fabricating the mask 200.

Referring to FIG. 4, a method of fabricating the mask includes the operations of forming a shielding unit of the mask pattern unit on a base metal using an electric plating method (S41), applying a photosensitive layer on the entire base metal including the mask pattern unit 210 as a masking material (S42), and exposing a part of the photosensitive layer corresponding to the mask pattern unit 210 (S43).

In addition, the method of fabricating the mask further includes the operations of attaching the reinforcing member 220 corresponding to the mask pattern unit 210 onto the photosensitive layer as a reinforcing rib supporting the mask pattern unit 210 (S44), and removing the exposed part of the photosensitive layer corresponding to the mask pattern unit 210 through a development process (S45).

In addition, the method of fabricating the mask further includes the operations of forming the buffer member 230 for bonding the mask pattern unit 210 on the base metal to the reinforcing member 220 using the electric plating method (S46), separating the base metal from the mask pattern unit 210 (S47), and forming the opening 212 defined by the shielding unit 211 of the mask pattern unit 210 by removing the photosensitive layer (S48).

In addition, the method may further include the operation of forming the mask frame assembly by attaching the mask as a pattern mask fabricated through the above processes onto the frame (S49).

FIGS. 5A through 5F are cross-sectional views of the mask for illustrating a method of fabricating the mask for depositing thin film, and FIGS. 5A through 5F are views of the mask taken along line IIIa-IIIb of FIG. 3.

Figure 5A:
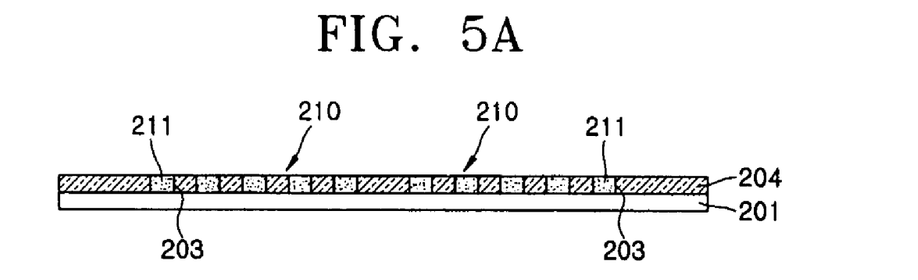
FIGS. 5A through 5F are cross-sectional views illustrating processes for fabricating the mask according to an embodiment.

Referring to FIG. 5A, a first photosensitive layer 204 is formed on the base metal 201 as a masking material including a plurality of openings 203, and the mask pattern unit 210 is formed on the opening 203 of the first photosensitive layer 204 using an electroforming method.

Here, the mask pattern unit 210 includes a plurality of shielding units 211 shown in FIG. 2, and the first photosensitive layer 204 remains between the shielding units 211 and is removed later. In addition, the openings formed by removing the first photosensitive layer 204 become the openings 212 of the mask pattern unit 210 defined by the shielding units 211.

A method of forming the mask pattern unit 210 on the base metal 201 using an electroforming method will be described with respect to FIGS. 6A through 6C as follows.

Figure 6A:
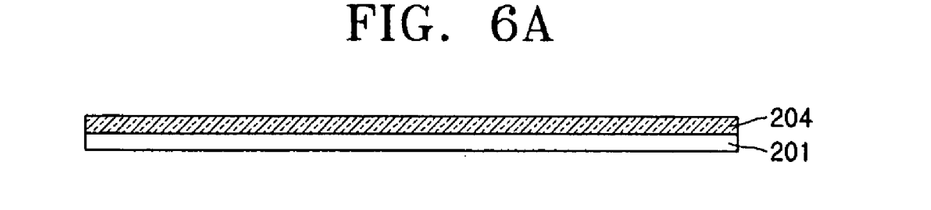
FIG. 6A through 6C are cross-sectional views illustrating a method for forming a mask pattern unit using an electric plating method during the processes of forming the mask for depositing the thin film according to one embodiment.
Figure 6B:
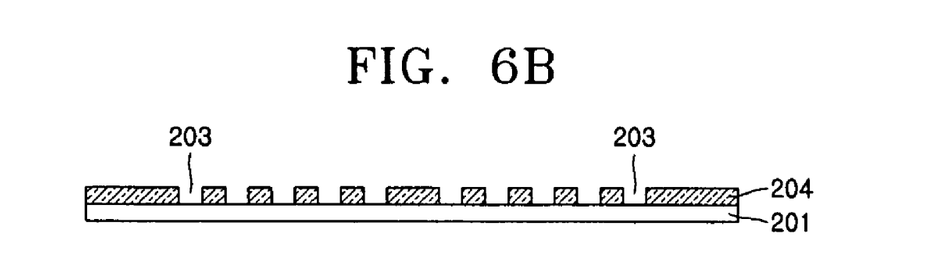

The first photosensitive layer 204 is applied on the base metal 201 as shown in FIG. 6A, and then, it is exposed and developed using a photomask (not shown) to form the opening 203 as shown in FIG. 6B.

Figure 6C:
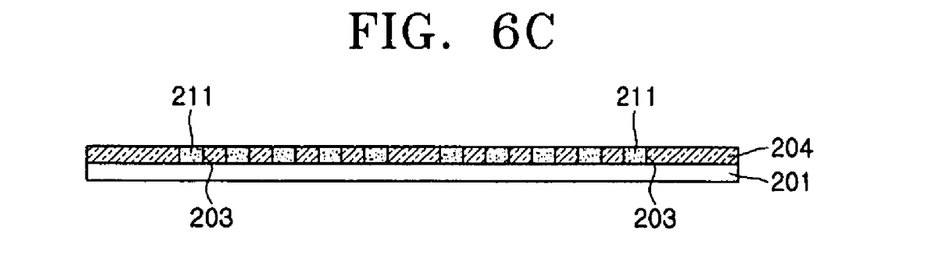

Here, referring to FIG. 6C, the shielding unit 211 of the mask pattern unit 210, which is formed of Ni—Co alloy layer, is formed in the opening 203 of the photosensitive layer 204 using an electroforming method such as electric plating method.

In one embodiment, the mask pattern unit 210 is formed of the metal material, that is, Ni—Co alloy layer, however, the material of the mask pattern unit 210 is not limited to above, but can be formed of other materials, such as invar, that is, Fe—Ni alloy layer or kovar material, that is Fe—Ni—Co alloy layer.

Figure 5B:
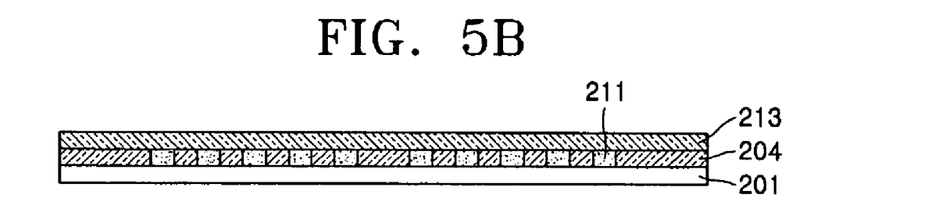
Figure 5C:
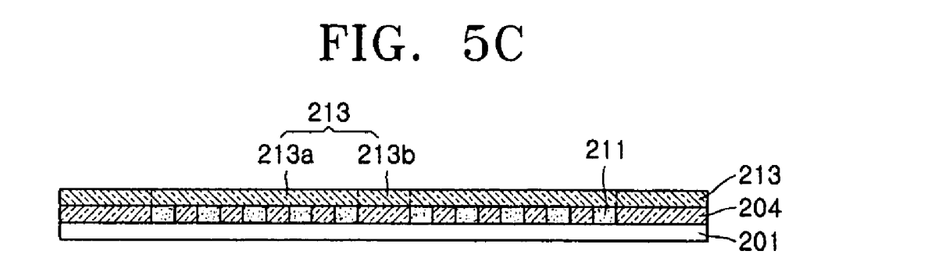

Referring to FIG. 5B, a second photosensitive layer 213 is applied onto the first photosensitive layer 204 of the base metal 201 and the shielding unit 211 of the mask pattern unit 210. Referring to FIG. 5C, a part 213a of the second photosensitive layer 213 corresponding to the mask pattern unit 210 is exposed through the exposure process. Remaining portion 213b of the second photosensitive layer 213 is not exposed.

Figure 5D:
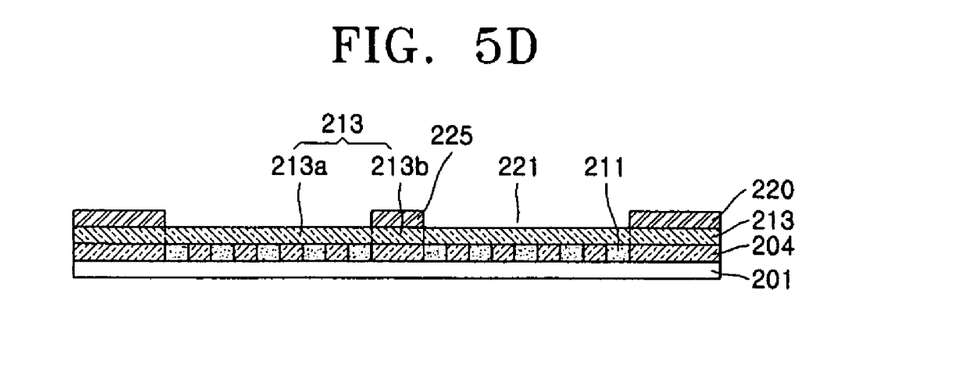

Referring to FIG. 5D, the mask pattern unit 210 is attached to the reinforcing rib. According to one embodiment, the reinforcing member 220 of invar material is used as the reinforcing rib to support the mask pattern unit 210. The reinforcing member 220 includes a material having low thermal expansion coefficient, and may be formed of invar material, that is Fe—Ni alloy layer. Therefore, since the material having low thermal expansion coefficient is used as the reinforcing member 220, the transformation of the mask pattern unit 210 due to the heat in the deposition process can be prevented.

The reinforcing member 220 includes a plurality of openings 221 at the portions corresponding to the mask pattern units 210. Here, the reinforcing member 220 is adjacent to the portion 213b of the photosensitive layer 213 that is not exposed to open the exposed portion 213a corresponding to the mask pattern unit 210 through the openings 221.

The opening 221 of the reinforcing member 220 corresponds to the exposed portion 213a of the second photosensitive layer 213, and accordingly, the opening 221 corresponds to the mask pattern unit 210. Therefore, when the second photosensitive layer 213 is removed later, the mask pattern unit 210 is opened through the opening 221 of the reinforcing member 220.

Figure 5E:
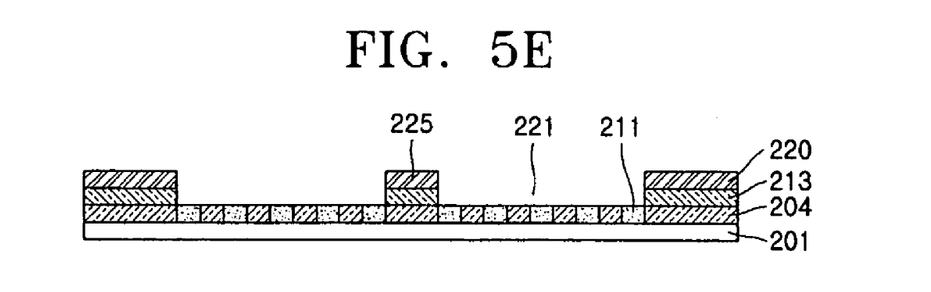

Referring to FIG. 5E, the portion of photosensitive layer 213 exposed by the opening 221 of the reinforcing member 220, that is, the portion 213a exposed through the exposure process corresponding to the mask pattern unit 210 is removed by the development process.

Figure 5F:
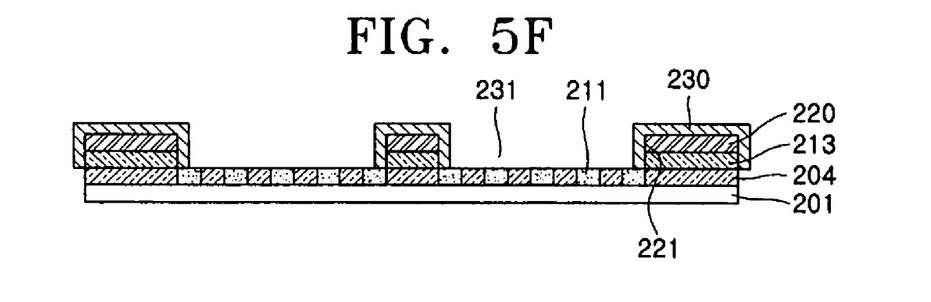

Referring to FIG. 5F, the buffer member 230 for attaching the mask pattern unit 210 formed on the base metal 201 to the reinforcing member 220 is formed. The buffer member 230 may include a Ni—Co alloy layer, and may be formed through an electric plating method.

Then, the base metal 201 is separated from the mask pattern unit 210, and the remaining first and second photosensitive layers 204 and 213 are removed, and the mask 200 is obtained.

Figure 7:
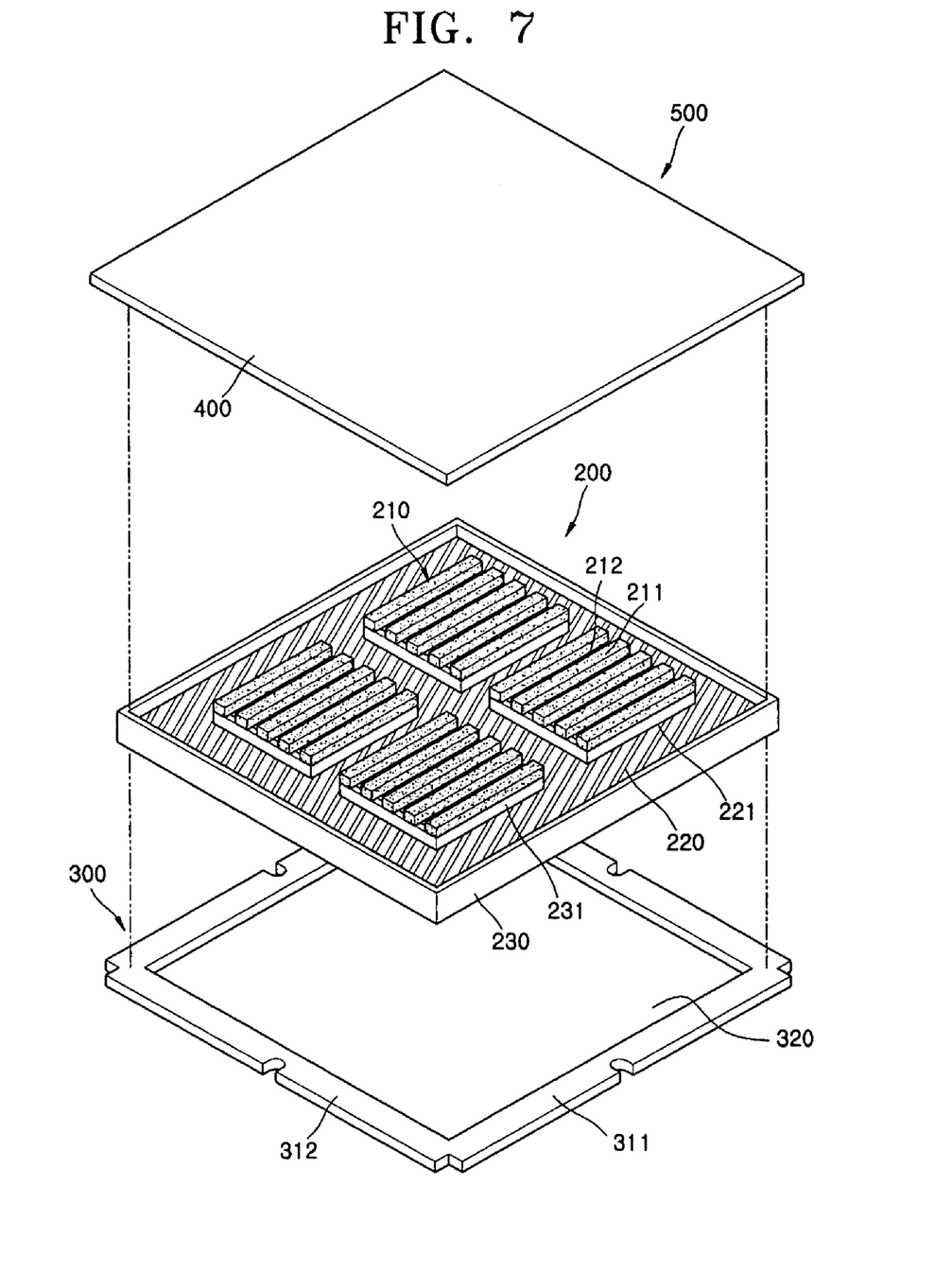
FIG. 7 is an exploded perspective view of a mask frame assembly for depositing the thin film of the flat panel display according to one embodiment.

FIG. 7 is an exploded perspective view of the mask frame assembly for depositing the thin film of the flat panel display according to one embodiment.

Referring to FIG. 7, the mask frame assembly 500 of one embodiment includes the pattern mask and a frame 300 for supporting the pattern mask. The pattern mask includes the mask 200 shown in FIGS. 2, 3A, and 3B.

The frame 300 includes a supporting bar 311 for supporting the left and right portions of the pattern mask 200, a supporting bar 312 for supporting the upper and lower portions of the pattern mask 200, and a single opening 320.

In the mask frame assembly 500 according to one embodiment, a deposition target substrate 400 is arranged with the pattern mask 200 to deposit a predetermined thin film. Here, the mask pattern unit 210 of the pattern mask 200 protrudes to connect with the deposition target substrate 400.

In the present embodiment, the pattern mask 200 can be formed in various structures, for example, the mask pattern unit 210 is supported by the reinforcing member formed of the invar material and the reinforcing member and the mask pattern unit 210 are supported by the buffer member 230, besides the structure shown in FIG. 7.

In some embodiments, the flat panel display is an OLED, however, various flat panel displays such as the liquid crystal display (LCD) can be used.

According to the mask and method of fabricating the mask, the following effects can be obtained.

Since the mask pattern unit is supported by the reinforcing member formed of the invar material having low thermal expansion coefficient, the transformation of the mask due to the heat in the process of depositing the thin film can be prevented, and the thin film of even thickness can be deposited.

In addition, the mask pattern unit and the reinforcing member are supported by the Ni—Co alloy layer, and thus, the mask is robust and the stress can be relieved.

Since the pattern of the pattern mask is formed using an electroforming method such as an electric plating method, the opening of the mask pattern unit and the position of the opening are made with high precision.

In addition, since the mask pattern unit of the pattern mask is not directly fixed onto the opening of the reinforcing member, but fixed by the buffer member and protrudes, the attaching force with the deposition target is of good quality.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A mask comprising:

a reinforcing member comprising at least one first opening;

a buffer member comprising at least one second opening corresponding to the first opening, and supporting the reinforcing member, wherein a portion of the buffer member protrudes through the first opening; and at least one mask pattern unit supported by the portion of the buffer member protruding through the first opening.

2. The mask of claim 1, wherein the reinforcing member comprises a material having a low coefficient of thermal expansion.

3. The mask of claim 2, wherein the reinforcing member comprises an invar material.

4. The mask of claim 1, wherein the buffer member comprises a conductive material.

5. The mask of claim 4, wherein the buffer member comprises a nickel-cobalt (Ni—Co) alloy layer.

6. The mask of claim 1, wherein each of the mask pattern units comprise:
- a plurality of third openings having a predetermined pattern, wherein the mask is configured to permit deposition of a thin film of the same predetermined pattern on a target substrate; and
- a plurality of shielding units, wherein the third openings are defined by the shielding units.

7. A mask frame assembly comprising:
a mask comprising:
- at least one mask pattern unit comprising a plurality of first openings having a pattern, wherein the mask is configured to deposit a thin film in the pattern on a target substrate;
- a reinforcing member comprising at least one second opening which corresponds to the mask pattern unit; and
- a buffer member including at least one third opening corresponding to the second opening, and supporting the reinforcing member, wherein a portion of the buffer member protrudes through the second opening and supports the mask pattern unit; and a frame including a fourth opening, the frame being configured to receive and support the mask.

8. The assembly of claim 7, wherein the reinforcing member comprises a material having a low coefficient of thermal expansion.

9. The assembly of claim 7, wherein the reinforcing member comprises an invar material.

10. The assembly of claim 7, wherein the buffer member comprises a conductive material.

11. The assembly of claim 7, wherein the buffer member comprises a nickel-cobalt (Ni—Co) alloy layer.

12. A method of fabricating a mask comprising:
forming a plurality of mask pattern units on a base metal;
forming a masking material on the base metal;
attaching a reinforcing member on the masking material, the reinforcing member comprising openings corresponding to the mask pattern units;
removing portions of the masking material corresponding to the mask pattern units;
attaching the mask pattern units onto the reinforcing member using a buffer member, wherein the buffer member protrudes through the openings in the reinforcing member so as to support the mask pattern units;
separating the base metal from the mask pattern units; and
removing the masking material.

13. The method of claim 12, wherein the reinforcing member includes a plurality of openings corresponding to the mask pattern units to support the mask pattern units.

14. The method of claim 13, wherein the reinforcing member comprises a material having low thermal expansion coefficient.

15. The method of claim 14, wherein the reinforcing member comprises an invar material.

16. The method of claim 12, wherein forming the mask pattern units comprises using an electroforming method.

17. The method of claim 12, wherein the buffer member comprises a conductive metal.

18. The method of claim 13, wherein the buffer member comprises a nickel-cobalt (Ni—Co) alloy layer.

19. The method of claim 12, further comprising forming the buffer member with an electroplating process.

20. The method of claim 12, wherein forming the masking material comprises applying a photosensitive layer on the base metal, and exposing some parts corresponding to the mask pattern units.

21. The method of claim 20, further comprising removing the parts on the masking material corresponding to the mask pattern units through a development process after attaching the reinforcing member onto the masking material and before attaching the mask pattern units onto the reinforcing member.

* * * * *

UNITED STATES PATENT AND TRADEMARK OFFICE
CERTIFICATE OF CORRECTION

| | | |
|---|---|---|
| PATENT NO. | : 7,572,338 B2 | Page 1 of 1 |
| APPLICATION NO. | : 11/281826 | |
| DATED | : August 11, 2009 | |
| INVENTOR(S) | : Kim et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 622 days.

Signed and Sealed this

Fourteenth Day of December, 2010

David J. Kappos
*Director of the United States Patent and Trademark Office*